(12) United States Patent
Yamamoto

(10) Patent No.: US 7,968,961 B2
(45) Date of Patent: Jun. 28, 2011

(54) SOLID-STATE IMAGE PICKUP DEVICE AND METHOD FOR MANUFACTURING THE SAME

(75) Inventor: Katsumi Yamamoto, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 7 days.

(21) Appl. No.: 12/385,762

(22) Filed: Apr. 17, 2009

(65) Prior Publication Data

US 2009/0200630 A1    Aug. 13, 2009

Related U.S. Application Data

(63) Continuation of application No. PCT/JP2007/071046, filed on Oct. 29, 2007.

(30) Foreign Application Priority Data

Nov. 2, 2006  (JP) .................................. 2006-299333
Nov. 2, 2006  (JP) .................................. 2006-299334

(51) Int. Cl.
H01L 31/0203    (2006.01)

(52) U.S. Cl. .................. 257/433; 257/704; 257/E31.11; 438/64

(58) Field of Classification Search .................. 257/685, 257/704, 432, 433, E21.499, E31.11; 438/7, 438/51, 64, 106, 116
See application file for complete search history.

(56) References Cited

U.S. PATENT DOCUMENTS

| | | | |
|---|---|---|---|
| 6,117,705 A * | 9/2000 | Glenn et al. .................. | 438/106 |
| 6,777,767 B2 * | 8/2004 | Badehi ........................... | 257/432 |
| 6,844,978 B2 * | 1/2005 | Harden et al. ................. | 359/619 |
| 6,917,401 B2 * | 7/2005 | Goang et al. .................. | 349/106 |
| 7,144,745 B2 * | 12/2006 | Badehi .............................. | 438/7 |
| 7,378,724 B2 * | 5/2008 | Yu et al. ......................... | 257/685 |
| 7,547,571 B2 * | 6/2009 | Chen et al. ...................... | 438/64 |
| 2004/0159920 A1 | 8/2004 | Omori | |
| 2006/0213804 A1 * | 9/2006 | Yu et al. ......................... | 206/710 |

FOREIGN PATENT DOCUMENTS

| | | |
|---|---|---|
| JP | 2002-231919 | 8/2002 |
| JP | 2002-329852 | 11/2002 |
| JP | 2003-92394 | 3/2003 |
| JP | 2004-193600 | 7/2004 |
| JP | 2005-252183 | 9/2005 |
| JP | 2006-147864 | 6/2006 |

OTHER PUBLICATIONS

International Search Report for PCT/JP2007/071046, mailed Jan. 29, 2008.

English Translation of the International Report on Patentability issued May 26, 2009 in corresponding International Patent Application PCT/JP2007/071046.

* cited by examiner

*Primary Examiner* — Thao X Le
*Assistant Examiner* — William F Kraig
(74) *Attorney, Agent, or Firm* — Staas & Halsey LLP

(57) ABSTRACT

A solid-state image pickup device which includes a solid-state image pickup chip, a transparent plate disposed to face a light-receiving surface of the solid-state image pickup chip, a frame-like spacer disposed on a peripheral portion of the light-receiving surface of the solid-state image pickup chip for maintaining a space between the solid-state image pickup chip and the transparent plate, and an adhesion layer sealing a circumferential gap formed between the solid-state image pickup chip and the transparent plate, wherein the spacer includes a plurality of partition walls.

6 Claims, 2 Drawing Sheets

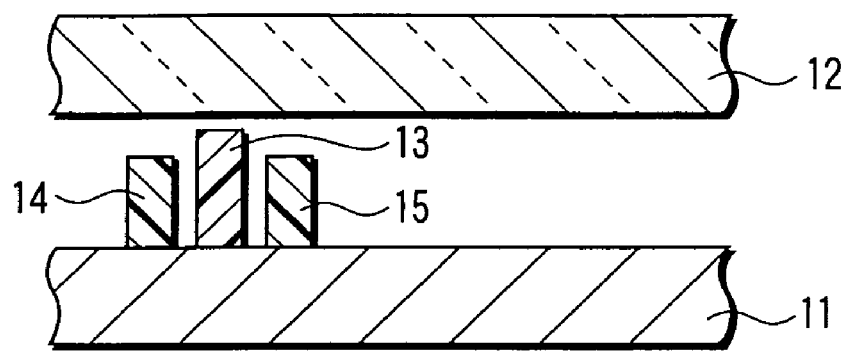
F I G. 4
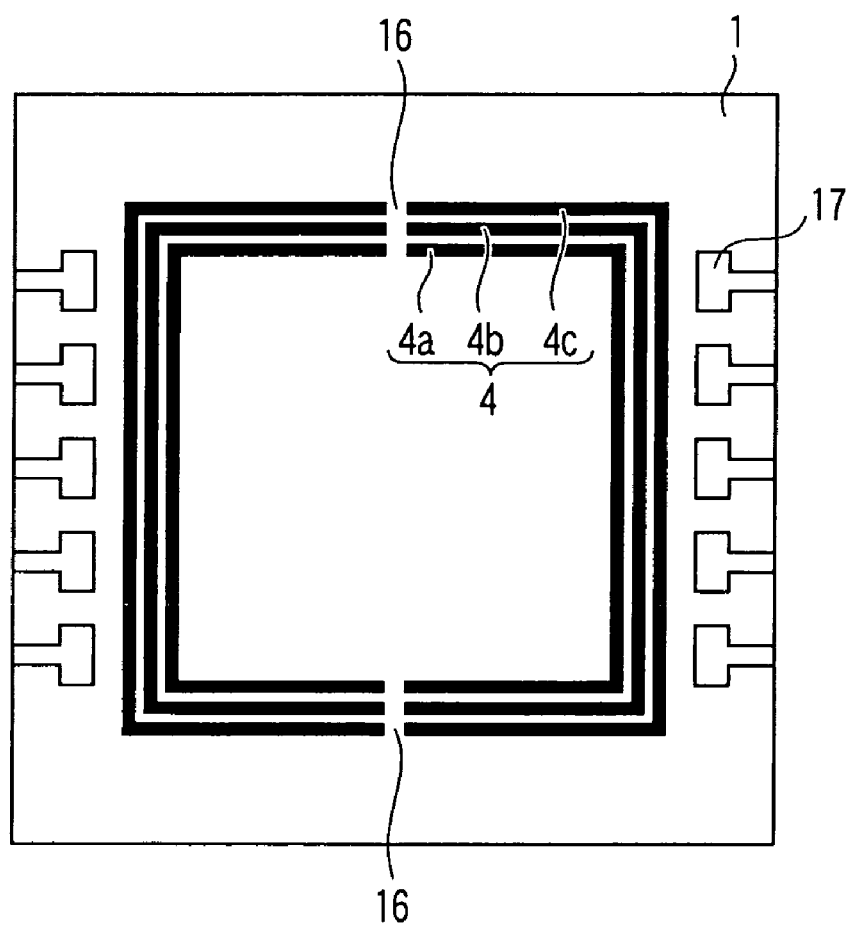
F I G. 5

SOLID-STATE IMAGE PICKUP DEVICE AND METHOD FOR MANUFACTURING THE SAME

CROSS-REFERENCE TO RELATED APPLICATIONS

This is a Continuation Application of PCT Application No. PCT/JP2007/071046, filed Oct. 29, 2007, which was published under PCT Article 21(2) in Japanese.

This application is based upon and claims the benefit of priority from prior Japanese Patent Applications No. 2006-299333, filed Nov. 2, 2006; and No. 2006-299334, filed Nov. 2, 2006, the entire contents of both of which are incorporated herein by reference.

BACKGROUND OF THE INVENTION

1. Field of the Invention

This invention relates to a solid-state image pickup device and a method for manufacturing the same. In particular, this invention relates to a solid-state image pickup device which makes it possible to uniformly maintain a distance between a wafer and a glass plate when the device is manufactured, and a method of manufacturing such a solid-state image pickup device.

2. Description of the Related Art

In recent years, digital cameras and video cameras utilizing a solid-state image pickup device such as a CCD or C-MOS element have been increasingly popularized and, at the same time, the techniques to further miniaturize the solid-state image pickup device by making use of a chip-size package (CSP) system have been developed. The solid-state image pickup device of such a small size is suitable in mounting it on electronic equipments such as mobile telephone where miniaturization, weight-saving and the reduction of thickness are desired.

This small scale solid-state image pickup device is constructed such that a solid-state image pickup chip having a large number of microlenses attached to the light-receiving surface thereof is disposed to face an infrared-cutting transparent glass plate with a spacer being interposed therebetween so as to uniformly maintain a predetermined distance between the chip and the glass plate, and that the peripheral gap portion between the chip and the glass plate is sealed with an adhesive (for example, JP-A 2002-329852).

The small scale solid-state image pickup device constructed in this manner can be manufactured by a method wherein a wafer having a plurality of the solid-state image pickup chips fabricated in one surface portion thereof is adhered face to face to an infrared-cutting transparent glass plate with a frame-like spacer being interposed therebetween and then the rear surface of the wafer is polished to reduce the thickness to about 30 to 100 μm, after which the resultant laminated body is cut so as to separate the solid-state image pickup chips individually, thus manufacturing the small scale solid-state image pickup device.

In this case, although the distance between the wafer and the infrared-cutting transparent glass plate is regulated by the height of the spacer, this distance is required to be uniform throughout the entire surface of the wafer having a diameter of 20-30 cm. However, the conventional spacer is accompanied with a problem that when pressure is applied to the infrared-cutting transparent glass plate on the occasion of laminating the glass plate to the wafer, the spacer is easily compressed so that it is impossible to uniformly maintain the distance between the wafer and glass plate throughout the entire surface of the wafer.

On the other hand, in the case of the conventional spacer, when pressure is applied to the infrared-cutting transparent glass plate on the occasion of laminating the glass plate to the wafer, bubbles may be entrapped on the inner side of the frame-like spacer, since this frame-like spacer is not provided with any kind outlet through which the gas existing inside the frame-like spacer is enabled to escape. Due to the pressure of this entrapped gas, an adhesive may be squeezed out of this assembled body, thus giving rise to the generation of defectives.

BRIEF SUMMARY OF THE INVENTION

It is a first object of the present invention to provide a solid-state image pickup device which is constructed such that even if a large pressure is applied to the device in a manufacturing process thereof, a distance between a wafer having a solid-state image pickup chip and a glass plate can be uniformly kept throughout the entire region and to provide a manufacturing method of such a solid-state image pickup device.

It is a second object of the present invention to provide a solid-state image pickup device which is constructed such that even if a large pressure is applied to the device in a manufacturing process thereof, bubbles can be prevented from being entrapped on the inner side of frame-like spacer, thereby preventing the generation of defectives.

According to a first aspect of the present invention, there is provided a solid-state image pickup device which comprises: a solid-state image pickup chip; a transparent plate disposed to face a light-receiving surface of the solid-state image pickup chip; a frame-like spacer disposed on a peripheral portion of the light-receiving surface of the solid-state image pickup chip for maintaining a space between the solid-state image pickup chip and the transparent plate; and an adhesion layer sealing a circumferential gap formed between the solid-state image pickup chip and the transparent plate; wherein the spacer includes a plurality of partition walls.

According to a second aspect of the present invention, there is provided a solid-state image pickup device described above, the method comprising: forming a spacer including a plurality of frame-like partition walls which are different in height and are formed on a surface of a wafer having a plurality of solid-state image pickup chips and/or on a surface of a transparent plate in such a manner that each of the frame-like partition walls is positioned at a peripheral portion of each of the solid-state image pickup chips or at that portion of the transparent plate which corresponds to the peripheral portion of each of the solid-state image pickup chips; laminating the wafer on the transparent plate with said plurality of frame-like partition walls being interposed therebetween by making use of an adhesive layer attached to the peripheral portion of each of solid-state image pickup chips mounted on the wafer to thereby create a laminated structure; and cutting the laminated structure to separate the solid-state image pickup chips individually.

In the solid-state image pickup device and the manufacturing method thereof, the spacer may include three partition walls. In this case, the spacer may include one higher partition wall and two lower partition walls positioned on inner and outer sides of the higher partition wall side by side.

Further, at least one of the partition walls which is positioned on the outermost side of the plurality of partition may be provided with a cut for use as an air vent.

Furthermore, the spacer may be formed of at least one resin selected from the group consisting of polyimide resin, epoxy resin and epoxy-acrylate resin.

According to the present invention, since the spacer includes a plurality of partition walls, especially by a plurality of partition walls varied in height, even if a large pressure is applied to the aforementioned laminated body on the occasion of laminating the wafer on the transparent plate in the manufacturing process of the solid-state image pickup device, it is possible to uniformly maintain the distance between the wafer and the transparent plate throughout the entire region thereof owing to the employment of two kinds of spacers differing in height which are designed to sustain, in double stages, the space between the wafer and the transparent plate.

Furthermore, since at least one of the partition walls which is positioned on the outermost side of the plurality of partition walls is provided with a cut for use as an air vent, it is possible to provide a solid-state image pickup device wherein bubbles can be prevented from being entrapped on the inner side of frame-like spacer even if a large pressure is applied to the device in a manufacturing process thereof, especially during the step of laminating the wafer on the transparent plate, thereby preventing the generation of defectives.

BRIEF DESCRIPTION OF THE SEVERAL VIEWS OF THE DRAWING

FIG. 4 is a cross-sectional view illustrating a further example of the arrangement of three partition walls constituting a spacer; and FIG. 5 is a top plan view illustrating the solid-state image pickup device which is provided with cuts wherein an infrared-cutting transparent glass plate is removed from the device.

DETAILED DESCRIPTION OF THE INVENTION

Next, specific embodiments of the present invention will be explained.

Figure 1:
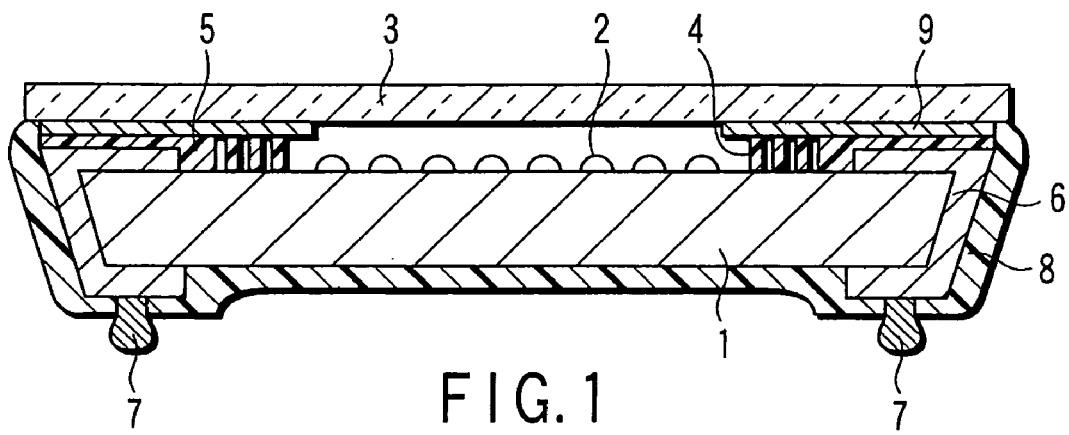
FIG. 1 is a cross-sectional view illustrating a solid-state image pickup device according to one embodiment of the present invention.

FIG. 1 is a cross-sectional view illustrating a solid-state image pickup device according to one embodiment of the present invention. Referring to FIG. 1, a plurality of microlenses 2 are formed on the upper surface (light-receiving surface) of a solid-state image pickup chip 1. A transparent plate, i.e., an infrared-cutting transparent glass plate 3 is disposed to face these microlenses 2. Incidentally, as a solid-state image pickup chip 1, it is possible to employ a charge coupled device (CCD) or complementary metal oxide semiconductor (CMOS) sensor.

Between the solid-state image pickup chip 1 and the infrared-cutting transparent glass plate 3, there is interposed a spacer 4 which is constituted by frame-like three partition walls for uniformly maintaining the interval between the chip 1 and the glass plate 3. The circumferential gap between the solid-state image pickup chip 1 and the infrared-cutting transparent glass plate 3 is sealed by making use of an adhesion layer 5 which is formed by curing an ultraviolet-ray curable resin.

Electrode pads (not shown) for solid-state image pickup elements are provided at an upper peripheral portion of the solid-state image pickup chip 1. Rear electrodes (not shown) are provided at an underside peripheral portion of the solid-state image pickup chip 1. For the purpose of electrically connecting the electrode pads with the rear electrodes, a sidewall-surrounding wiring layer 6 is provided so as to extend from an upper peripheral portion of the solid-state image pickup chip 1 via the sidewall thereof to the underside peripheral portion thereof. Bumps 7 for external connection are respectively formed so as to enable each of the bumps 7 to be electrically connected with a portion of the sidewall-surrounding wiring layer 6 which is located at the underside peripheral portion of the solid-state image pickup chip 1.

The sidewall and bottom of the structure configured as described above are covered with an insulating layer 8 made of a solder resist. Further, a light-shielding thin film 9 is formed on a peripheral portion of the underside of infrared-cutting transparent glass plate 3 so as to cover a region surrounding the microlenses 2.

The solid-state image pickup device which is constructed as described above can be manufactured according to the following manufacturing process.

Figure 2:
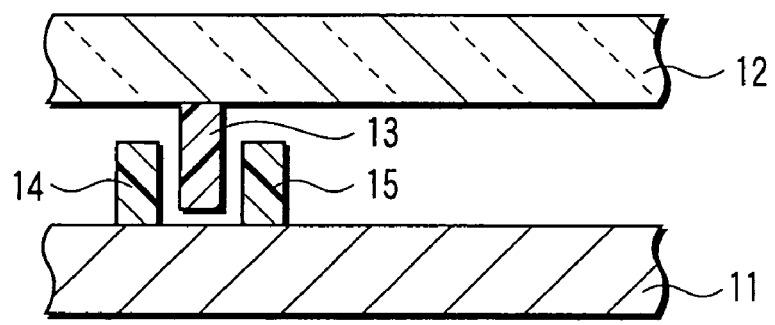
FIG. 2 is a cross-sectional view illustrating the arrangement of three partition walls constituting a spacer in the manufacturing process of the solid-state image pickup device shown in FIG. 1.

First of all, a wafer having a plurality of solid-state image pickup chips formed thereon, each chip having a plurality of microlenses formed on the upper surface thereof, is prepared and, at the same time, a transparent glass plate having the same size as that of the wafer is prepared. Then, a plurality of partition walls varied in height are formed on a surface of the wafer and/or on a surface of the transparent glass plate in such a manner that the partition walls are positioned at a peripheral portion of each of the solid-state image pickup chips or at that portions of the transparent glass plate which correspond to the peripheral portion of each of the solid-state image pickup chips. FIG. 2 shows one example of such a structure as described above.

Specifically, FIG. 2 shows an enlarged view of a portion of the lamination consisting of the wafer 11 and the transparent plate 12, both disposed face to face, where a spacer is provided. In this FIG. 2, a first partition wall 13 which is relatively large in height is mounted on the underside of the transparent plate 12 and a second and a third partition walls 14 and 15 both relatively smaller in height than that of the first partition wall 13 are mounted on the top surface of the wafer 11 in such a manner that these partition walls 14 and 15 are positioned on the opposite sides of the first partition wall 13. With the provision of these first, second and third partition walls, the spacer 4 shown in FIG. 1 is constructed.

The height of the first partition wall 13 is 50-120 μm for example and the width thereof is 70-150 μm for example. Further, the height of each of the second and third partition walls 14 and 15 should be higher than the height of the microlenses 2 so as to prevent the microlenses 2 from being contacted and damaged by the transparent plate and is 40-100 μm for example and the width thereof is 70-150 μm for example.

These partition walls can be formed by patterning a layer of a commercially available photosensitive resin composition by making use of photolithography. As for the resin useful in this case, it is possible to employ polyimide resin, epoxy resin and epoxy-acrylate resin.

Then, an adhesive made of ultraviolet-ray curable resin, etc., is coated on a portion of the wafer which is located outside the partition walls. Thereafter, the wafer is laminated on and bonded with the transparent glass plate.

When the wafer is laminated on the transparent glass plate, a large pressure is applied to the transparent glass plate. As a result, the first partition wall 13 having a larger height is compressed and reduced in height and hence the distance between the wafer and the transparent plate is caused to reduce. However, because of the second and third partition walls 14 and 15 which are positioned on the opposite sides of the first partition wall 13, the distance between the wafer and the transparent plate cannot be reduced any more, thereby making it possible to uniformly maintain the distance all over the entire region. Namely, due to the provision of the spacer which is constituted by the first partition wall 13 having a predetermined resiliency and by the second and third partition walls 14 and 15 which are relatively low in height, it is possible to uniformly maintain the distance between the wafer and the transparent plate throughout the entire region even if a large pressure is applied thereto when the wafer is laminated on the transparent glass plate.

After finishing the lamination, the adhesive layer is cured by the irradiation of ultraviolet rays, etc., thereby making it possible to fix the distance between the wafer and the transparent plate.

Thereafter, this laminated structure is cut along the line of the adhesive layer by making use of a dicing machine to thereby separate the solid-state image pickup chips individually. Then, the sidewall-surrounding wiring layer 6 and an insulating layer 8 formed of a solder resist are successively formed and bumps 7 for external connection are formed through a hole created in the insulating layer 8, thereby manufacturing a solid-state image pickup device which is equipped with a single solid-state image pickup chip as shown in FIG. 1.

In the case of the embodiment shown in FIG. 2, a first partition wall 13 which is relatively large in height is formed on the underside of the transparent plate 12 and a second and a third partition walls 14 and 15 both relatively smaller in height than that of the first partition wall 13 are formed on the top surface of the wafer 11. However, the present invention is not limited to such an embodiment. Namely, the arrangement of the partition walls may be variously modified.

Figure 3:
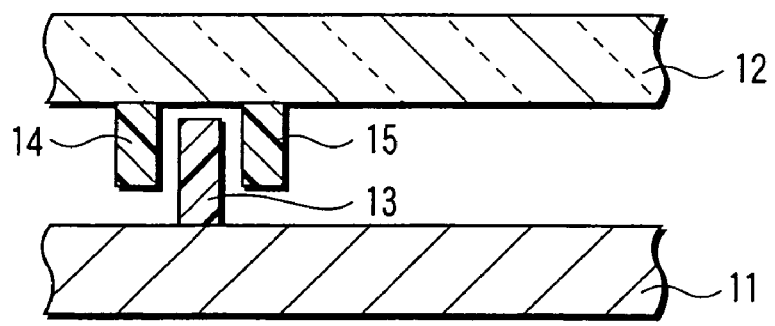
FIG. 3 is a cross-sectional view illustrating another example of the arrangement of three partition walls constituting a spacer.

For example, FIG. 3 illustrate another example wherein the first partition wall 13 which is relatively large in height is formed on the top surface of the wafer 11 and the second and the third partition walls 14 and 15 both relatively smaller in height than that of the first partition wall 13 are formed on the underside of the transparent plate 12. Further, FIG. 4 illustrate a further example wherein the first partition wall 13 which is relatively large in height and the second and the third partition walls 14 and 15 both relatively smaller in height are all formed on the top surface of the wafer 11.

In the foregoing embodiments, a partition wall which is relatively large in height is formed at a central portion and partition walls which are relatively smaller in height are formed on the opposite sides of this higher partition wall. However, the present invention is not limited to such an embodiment. Namely, it is also possible assemble these partition walls in such a manner that two lower partition walls are disposed on the inner or outer side of one higher partition wall. However, when three partition walls are to be employed, two of them should preferably be constituted a lower partition wall in order to reliably and uniformly maintain the distance between the wafer and the transparent plate.

Incidentally, the number of partition walls may not be limited to three but may be four or more. Further, under some circumstances, the number of partition walls may be two.

FIG. 5 is a top plan view of the solid-state image pickup chip 1 wherein an infrared-cutting transparent glass plate 3 is removed from the device, which represents another embodiment of the present invention. In this FIG. 5, the microlenses are omitted. As shown in FIG. 5, three rectangular frame-like partition walls 4a, 4b and 4c differing in size each other and constituting the spacer 4 are arranged so as to surround, in triple boxes, the light-receiving surface of the top surface of solid-state image pickup chip 1. Namely, the size of these partition walls 4a, 4b and 4c are made larger in the mentioned order and arranged in a form of nested boxes. Further, these three partition walls 4a, 4b and 4c are respectively provided with two cuts 16 at opposite sides thereof so as to face each other, these cuts 16 of partition walls 4a, 4b and 4c being positioned so as to align with each other.

The height of these three partition walls 4a, 4b and 4c is respectively regulated so as to prevent the microlenses 2 from being contacted and damaged by the transparent glass plate so that the height of these three partition walls 4a, 4b and 4c is set higher than the height of the microlenses 2 and is regulated to 40-100 μm for example and the width thereof to 70-150 μm for example.

With respect to the width of the cuts 16, there is not any particular limitation as long as air can be escaped on the occasion of pushing the laminated body at the step of lamination. However, it may be confined to 70 to 300 μm in general.

On the right and left sides of the spacer 4 which is constituted by these three partition walls 4a, 4b and 4c, there are provided with electrode pads 17 which are respectively electrically connected with the sidewall-surrounding wiring layer 6.

As shown in FIG. 1, the circumferential gap between the solid-state image pickup chip 1 and the infrared-cutting transparent glass plate 3 is sealed by making use of an adhesion layer 5 which is formed through the curing of an ultraviolet-ray curable resin.

Rear electrodes (not shown) are provided at an underside peripheral portion of the solid-state image pickup chip 1. For the purpose of electrically connecting the electrode pads 17 which are provided on an upper peripheral portion with the rear electrodes, a sidewall-surrounding wiring layer 6 is provided so as to extend from an upper peripheral portion of the solid-state image pickup chip 1 via the sidewall thereof to the underside peripheral portion thereof. Bumps 7 for external connection are respectively formed at and connected with a portion of the sidewall-surrounding wiring layer 6 which is located at the underside peripheral portion of the solid-state image pickup chip 1.

In the embodiment shown in FIG. 5, three partition walls 4a, 4b and 4c are respectively provided with two cuts 16 in a manner to align with each other. However, the number of cuts 16 may be changed such that the partition walls 4a, 4b and 4c are respectively provided with only one cut or provided with three or more. Further, with respect to the position of these cuts, these cuts may not be positioned in a manner to align with each other but may be offset among the partition walls 4a, 4b and 4c.

What is claimed is:
1. A solid-state image pickup device which comprises:
   a solid-state image pickup chip;
   a transparent plate disposed to face a light receiving surface of the solid-state image pickup chip;
   a frame-like spacer disposed on a peripheral portion of the light-receiving surface of the solid-state image pickup chip to maintain a space between the solid-state image pickup chip and the transparent plate; and an adhesion layer sealing a circumferential gap formed between the solid-state image pickup chip and the transparent plate;

wherein the frame-like spacer has three partition walls including one higher partition wall and two lower partition walls positioned side by side on inner and outer sides of the higher partition wall.

2. The solid-state image pickup device according to claim 1, wherein the frame-like spacer is formed of at least one resin selected from the group consisting of polyimide resin, epoxy resin and epoxy-acrylate resin.

3. The solid-state image pickup device according to claim 1, wherein at least one of the partition walls which is positioned on the outermost side of the three partition walls is provided with a cut for use as an air vent.

4. A method of manufacturing a solid-state image pickup device claimed in claim 1, comprising:

forming the frame-like spacer having the three frame-like partition walls including the one higher partition wall and the two lower partition walls positioned side by side on the inner and outer sides of the higher partition wall which are formed on a surface of a wafer having a plurality of solid-state image pickup chips and/or on a surface of the transparent plate in such a manner that each of the three frame-like partition walls is positioned at a peripheral portion of each of the solid-state image pickup chips or at that portion of the transparent plate which corresponds to said peripheral portion of each of the solid-state image pickup chips;

laminating the wafer on the transparent plate with said three frame-like partition walls being interposed therebetween by making use of the adhesion layer attached to the peripheral portion of each of the solid-state image pickup chips mounted on the wafer to thereby create a laminated structure; and cutting the laminated structure to separate the solid-state image pickup chips individually.

5. The method according to claim 4, wherein the frame-like spacer is formed of at least one resin selected from the group consisting of polyimide resin, epoxy resin and epoxy-acrylate resin.

6. The method according to claim 4, which further comprises forming a cut for use as an air vent in at least one of the three frame-like partition walls which is positioned on the outermost side of the three frame-like partition walls.

* * * * *